(12) United States Patent
Masuda

(10) Patent No.: US 6,426,654 B2
(45) Date of Patent: Jul. 30, 2002

(54) SIGNAL TRANSMISSION CIRCUIT ON SEMICONDUCTOR INTEGRATED CIRCUIT CHIP

(75) Inventor: Noboru Masuda, Tokorozawa (JP)

(73) Assignee: Hitachi, Ltd., Toyko (JP)

( * ) Notice: Subject to any disclaimer, the term of this patent is extended or adjusted under 35 U.S.C. 154(b) by 0 days.

(21) Appl. No.: 09/734,889

(22) Filed: Dec. 13, 2000

(30) Foreign Application Priority Data

Dec. 16, 1999 (JP) ............................................ 11-356762

(51) Int. Cl.⁷ ............................................ H03K 19/096
(52) U.S. Cl. .............................. 326/98; 326/93; 326/86
(58) Field of Search ............................ 326/93, 95, 98, 326/82, 83, 86

(56) References Cited

U.S. PATENT DOCUMENTS

| | | | |
|---|---|---|---|
| 4,883,989 A | | 11/1989 | Mizukami |
| 6,157,204 A | * | 12/2000 | Sher et al. ..................... 326/83 |
| 6,240,035 B1 | * | 5/2001 | Noda et al. .................. 327/544 |
| 6,249,147 B1 | * | 6/2001 | Vinh et al. ..................... 326/83 |

FOREIGN PATENT DOCUMENTS

JP          6334042       12/1994

* cited by examiner

Primary Examiner—Don Phu Le
(74) Attorney, Agent, or Firm—Antonelli, Terry, Stout & Kraus, LLP

(57) ABSTRACT

Disclosed herein is a dynamic type circuit which transmits a signal between relatively long-distant circuit blocks lying within a semiconductor integrated circuit chip. A whole signal path thereof comprises a plurality of sections. A section formed by a first type of signal line, which is precharged to a high level and to which a decision as to whether it is driven to a low level according to a signal inputted from a preceding section or it is left in floating state, is made, and a section formed by a second type of signal line, which is precharged to a low level in reverse and to which a decision as to whether it is driven to a high level according to a signal inputted from a preceding section or it is left in a floating state, is made, exist in alternate shifts. The respective sections are respectively connected to preceding-stage sections through MOS transistors for driving signal lines for the sections. MOS transistors for precharge are respectively connected to the signal lines for the respective sections at plural positions where a signal line is partitioned into substantially uniform intervals.

9 Claims, 10 Drawing Sheets

SIGNAL TRANSMISSION CIRCUIT ON SEMICONDUCTOR INTEGRATED CIRCUIT CHIP

BACKGROUND OF THE INVENTION

1. Field of the Invention

The present invention relates to a signal transmission circuit placed on a CMOS semiconductor integrated circuit chip, and particularly to a circuit for transmitting a signal over long-distance sections at high speed.

2. Description of the Related Art

A technique capable of, when a long-distance signal line is caused to transmit a signal within a semiconductor integrated circuit chip, dividing the signal line every suitable lengths and providing buffers to thereby control an increase in delay time due to the resistance of the signal line has been disclosed in Japanese Published Unexamined Patent Application No. Hei 06-334042.

An example in which a bus, which performs a dynamic operation, is divided to provide relaying means, has been disclosed in U.S. Pat. No. 4,883,989. This example will be explained with reference to FIG. 15. A first bus 12 is connected to a gate of an N channel type MOS transistor (hereinafter called "NMOS transistor") through a CMOS inverter 16. A P channel type MOS transistor (hereinafter called "PMOS transistor") 19 to which a clock identical to a clock φ for precharge of the first bus is applied, is connected in tandem with the NMOS transistor 17, and a second bus 13 is connected to its connecting node. Thus, a change in the potential of the first bus 12 subsequent to the precharge of the first bus 12 appears similarly even in the case of the second bus 13, and signal transmission is carried out. Incidentally, the transmission of a signal from the second bus 12 to the first bus 13 can also be implemented by a connecting circuit similar to above, which comprises a CMOS inverter 18, and a cascade circuit of a PMOS transistor 14 and an NMOS transistor 19.

Incidentally, the disclosure of U.S. Ser. No. 09/599,738 corresponding to the prior application assigned by the same assignee as the present application is related to the present application except for the above-descried example known per se in the art.

SUMMARY OF THE INVENTION

As in the prior art example disclosed in Japanese Published Unexamined Patent Application No. Hei 06-334042 referred to above, the delay time developed due to the resistance of the signal line can be shortened where the long-distance signal line is divided to interpose the buffers therein. However, a delay time associated with the passage of the signal through each buffer is developed as alternated. Thus, it is useful to divide, every suitable lengths, such an extremely long signal line that the delay time developed due to the resistance of the signal line becomes greater than the delay time developed due to each buffer and provide the buffers. However, if the signal line is divided short so that the delay time developed due to the resistance of the signal line becomes nearly equal to or less than the delay time developed due to the buffer, then the time necessary for the signal transmission becomes long in reverse.

In the structure disclosed in U.S. Pat. No. 4,883,989, the signal passes through the active elements of two stages comprised of the inverter and NMOS transistor until it is transmitted from the first bus to the second bus. Thus, the relaying means provides a large delay time for the signal as compared with the buffers disclosed in Japanese Published Unexamined Patent Application No. Hei 06-334042 referred to above.

Therefore, one object of the present invention is to provide a signal transmission circuit capable of transmitting a signal over a relatively long distance on a semiconductor integrated circuit chip in a shorter delay time.

Another object of the present invention is to decrease the number of active elements such as MOS transistors or the like interposed in a signal transmission path and reduce a total gate width of these elements necessary for signal transmission to thereby contribute to high integration of a semiconductor integrated circuit.

A signal transmission circuit of the present invention is basically a dynamic circuit. That is, a signal line for signal transmission is periodically precharged to a specific potential (first potential) by elements for precharge and is driven to another potential (second potential) by driving elements according to the level of an input signal.

A typical embodiment disclosed by the present application is characterized in that elements for precharge are respectively connected to a single signal line, i.e., a continuous signal line with no buffers or active elements for relay interposed in the way thereof, at three or more places. Described more specifically, a plurality of elements for precharge are respectively connected to the signal line at a start or leading point of the single signal line, i.e., a position near a connecting point from an element for driving the signal line, an end thereof, i.e., a position near a connecting point to the next-stage element for the signal line, and a position located between these.

According to the present structure, since each individual precharge elements precharge the signal line under their sharing even in the case of the transmission of a signal over a relatively long distance, it is possible to avoid a delay in precharge operation due to the resistance of the signal line. As a result, high-speed signal transmission is allowed.

A characteristic of another embodiment disclosed by the present application resides in that relaying elements are interposed in plural places lying in the course of a signal transmission circuit. That is, a signal path includes a plurality of signal line sections partitioned by these relaying elements. Described more specifically, the signal path is configured in such a manner that a first type of signal line section precharged to a first potential and having a positive operation for driving it to a second potential, and a second type of signal line section precharged to the second potential in reverse and having a negative operation for driving it to the first potential are placed alternately from the upstream side to the downstream side. A relaying element from the first type of signal line section to the second type of signal line section is an active element for driving a signal line of a subsequent stage to the first potential according to the driving of a signal line of a preceding stage to the second potential. Each of the second type of signal lines is an active element for driving a signal line of a subsequent stage to the first potential according to the driving a signal line of a preceding stage to the second potential. These active elements are typified by MOS transistors.

Elements for precharge are connected even to each individuals of these plural signal line sections at their plural places.

Even in the case of such a structure, avoidance of a delay in precharge operation can be achieved owing the above sharing of precharge. Further, since each of the relaying elements interposed in the signal transmission path is one active element, a transmission delay can be reduced as compared with the prior art example in which the active elements of the two stages relay the signal line sections.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DESCRIPTION OF THE PREFERRED EMBODIMENTS

Preferred embodiments of signal transmission circuits and semiconductor integrated circuit devices according to the present invention will next be described below in detail by specific embodiments with reference to the accompanying drawings.

Embodiment 1

Figure 1:
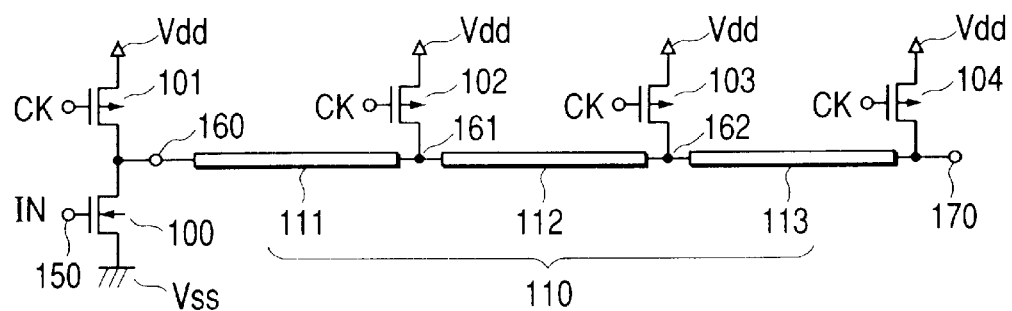
FIG. 1 is a circuit diagram showing one embodiment of a signal transmission circuit according to the present invention.

FIG. 1 is a circuit diagram showing one embodiment of a signal transmission circuit according to the present invention.

A relatively long-distance signal line 110 is drawn from an output node 160 of a driving NMOS transistor 100 to a point 170 for connecting to a circuit block corresponding to the next stage. PMOS transistors 101, 102, 103 and 104 for respectively precharging the signal line are respectively electrically connected to intermediate nodes 161 and 162 placed in positions where the signal line is divided at substantially equal intervals, and to the neighborhoods of both ends of the signal line. The sources of these PMOS transistors are respectively connected to a power source Vdd on the high-potential side. A clock signal CK, which periodically repeats a high level and a low level, is applied to the gates of these PMOS transistors respectively. The source of the NMOS transistor 100 is connected to a power source Vss corresponding to a low potential. A signal IN inputted to an input terminal 150 is applied to a gate electrode of the NMOS transistor 100. The width of the gate of the NMOS transistor 100 is designed so that a current equal to or greater than the sum of currents capable of flowing in the PMOS transistors 101 through 104 is capable of flowing in the NMOS transistor 100. Incidentally, the circuit according to the present embodiment constitutes some of a large scale integrated circuit on a semiconductor chip. This is similarly applied even to all the embodiments shown below.

The operation of the present circuit will next be explained. The input signal IN is applied so as to reach a low level whenever the clock signal CK is brought to the low level. At this time, the NMOS transistor 100 is cut off and the PMOS transistors 101 through 104 are brought into conduction. Thus, the output node 160, the intermediate nodes 161 and 162 and the point 170 for connection to the next stage are rendered high in level. This is called a precharged state.

Thereafter, as long as the input signal IN is low in level even if the clock signal CK is brought to the high level, the potentials at the nodes 160 through 162 and 170 are held as they are high in level.

Thereafter, when the input signal IN goes high in level, the NMOS transistor 100 is brought into conduction so that the potentials at the nodes 160 through 162 and 170 successively reach the low level. That is, whether the potential at the point 170 for connection to the next stage is brought to the low level, is determined according to whether the input signal 150 is brought to the high level while the clock signal CK is high in level, whereby the signal is transmitted to the following stage.

Since the plurality of PMOS transistors 101 through 104 for precharge are connected to their corresponding distributed positions of the signal line 110 in the present embodiment, a current for charging the parasitic capacitance of the signal line and the input capacitance of the next-stage circuit connected to the connecting point 170 is distributed to the PMOS transistors 101 through 104 and supplied from a large number of points. That is, since the current for charging each point in the signal line 110 does not flow from each far-off MOS transistor through the long-distance signal line upon precharge, a delay in precharge time due to the resistance of the signal line is less reduced.

Figure 2:
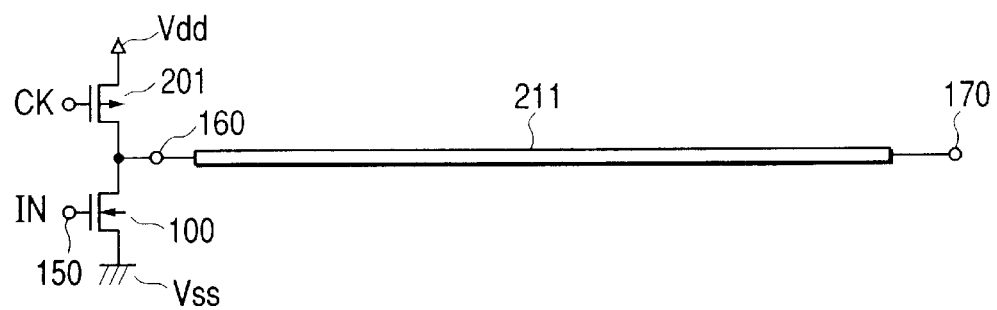
FIG. 2 is a circuit diagram illustrating one example of a conventional signal transmission circuit.

For the sake of comparison, an example in which a signal transmission circuit for transmitting a signal over the same distance as FIG. 1 is configured using the conventional dynamic circuit, is now shown in FIG. 2. The length of a signal line 211 represents a total of lengths of signal-line sections 111, 112 and 113 at which the signal line 110 employed in the present embodiment shown in FIG. 1 is partitioned at the positions of the nodes 161 and 162. The resistance of the signal line 211 becomes equal to the sum of the resistances of the signal-line sections 111 through 113.

In the conventional example shown in FIG. 2, a current for precharging the parasitic capacitance of a portion near a connecting point 170, of the signal line 211 and the input capacitance of a next-stage circuit connected to the connecting point 170 flows from a MOS transistor 201 via substantially the whole length of the signal line 211. Thus, assuming that the width of the gate of the MOS transistor 201 is designed so as to become equal to the sum of the gate widths of the MOS transistors 101 through 104 shown in FIG. 1, the resistance of the signal line 211 is larger than that of each of the signal-line sections 111 through 113. Therefore, the time required to perform precharge is spent or taken long in the prior art example of FIG. 2 as compared with the present embodiment shown in FIG. 1.

In other words, if the sum of the gate widths of the PMOS transistors 101 through 104 employed in the present embodiment shown in FIG. 1 is set equal to the gate width of the PMOS transistor 201 shown in FIG. 2, then the precharge can be carried out in a time shorter than that used for the conventional configuration shown in FIG. 2.

If the time intervals necessary for the precharge are made identical to each other in reverse, then the sum of the gate widths of the PMOS transistors 101 through 104 employed in the present embodiment shown in FIG. 1 can be made smaller than the gate width of the PMOS transistor 201 shown in FIG. 2. Thus, the parasitic capacitance added to the signal line is reduced and the time required for a signal inputted from an input terminal 150 to reach the connecting point 170 to the following stage along the signal line 110 can be shortened.

Since the signal-line sections 111 and 112 and the signal-line sections 112 and 113 are not partitioned therebetween respectively in the present embodiment, a delay time required for the signal to pass through a buffer or the like is not developed.

While the PMOS transistors 101 through 104 for performing the precharge are provided at the four points in the present embodiment, the signal line can be precharged at a speed faster than ever if elements for precharge are connected to three points of at least the neighborhood of a driving element, an intermediate point and the neighborhood of a point for connection to the next stage, whereby high-speed signal transmission can be carried out.

The gate electrode of the NMOS transistor 100 employed in the present embodiment can directly receive signals supplied from another signal transmission circuit and a flip-flop as the input terminal of the signal transmission circuit. Thus, the element through which the signal received at the input terminal 150 passes up to the transmission thereof to the node 160, may use one NMOS transistor and needs not spend the delay time necessary for the signal to only pass through the elements corresponding to the two stages as in the case of the precharge bus connecting circuit disclosed in U.S. Pat. No. 4,883,989.

Incidentally, the relationship between the number of these precharge PMOS transistors to be provided, employed in the present embodiment shown in FIG. 1 and the degree or magnitude of the effect of speeding up will be explained below. If the PMOS transistors are provided at equal intervals at n points (where n: integer greater than or equal to 3) including the positions indicated by the node 160 and the point 170 for connection to the next stage, then the long-distance signal line is divided into (n−1) sections, and the resistance and parasitic capacitance of each section result in 1/(n−1) of a proportion at the time that the PMOS transistors are provided at two points. On the other hand, assuming that the parasitic capacitance added by each PMOS transistor is constant, the gate width set for each PMOS transistor results in two nth or 2/n at the time that the PMOS transistors are provided at the two points alone, and on resistance set for each PMOS transistor results in n second or n/2.

When, at this time, the resistance set for each divided section is much larger than the on resistance set for each PMOS transistor, the time required to perform the precharge is shortened substantially in inverse proportion to (n−1) squared because it is substantially proportional to the product of the resistance and parasitic capacitance. Since the gate width for each PMOS transistor can be further reduced if time intervals necessary for precharge may be identical, the parasitic capacitance added by each PMOS transistor can be reduced. It is thus possible to obtain a great effect.

When the on resistance set for each PMOS transistor is much larger than the resistance set for each of signal-line sections divided into (n−1) lines in reverse, the time necessary for precharge is substantially kept constant regardless of n because it is substantially proportional to the product of the resistance and parasitic capacitance of the signal line. Thus, the parasitic capacitance added by each PMOS transistor cannot be reduced. If consideration is given to an increase in the number of locations (each corresponding to a point designated at reference mark CK in FIG. 1) to supply the clock signal, then much demerit is suffered.

Determining the number of divisions so that the on resistance set for each PMOS transistor is nearly equal to the resistance set for each signal-line section is thus most suitable. Of course, a reasonable effect can be expected even if it is slightly beyond the optimum condition.

Embodiment 2

Figure 3:
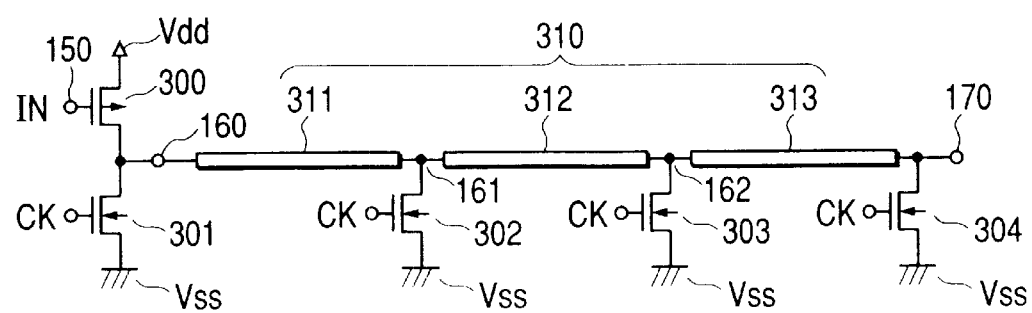
FIG. 3 is a circuit diagram depicting another embodiment of a signal transmission circuit according to the present invention.

FIG. 3 is a circuit diagram showing another embodiment of a signal transmission circuit according to the present invention and shows a circuit configuration in which the polarities employed in the embodiment shown in FIG. 1 are set in reverse. A PMOS transistor 300 employed in the present embodiment operates in a manner similar to the NMOS transistor 100 employed in the embodiment shown in FIG. 1. NMOS transistors 301 through 304 act in a manner similar to the PMOS transistors 101 through 104 employed in the embodiment shown in FIG. 1. An input signal IN and a clock signal CK on the transmitting-end side are also applied with polarities opposite to those of the input signal IN and clock signal CK on the transmitting-end side in the embodiment shown in FIG. 1. That is, when a signal line 310 is precharged to a low level Vss during a period in which the clock signal CK is high in level, and the input signal IN is driven to a low level during a period in which the clock signal CK is low in level, the signal line 310 is driven to a high level Vdd, whereby a signal is transmitted. A precharge rate is similar to that employed in the embodiment shown in FIG. 1.

Embodiment 3

Figure 4:
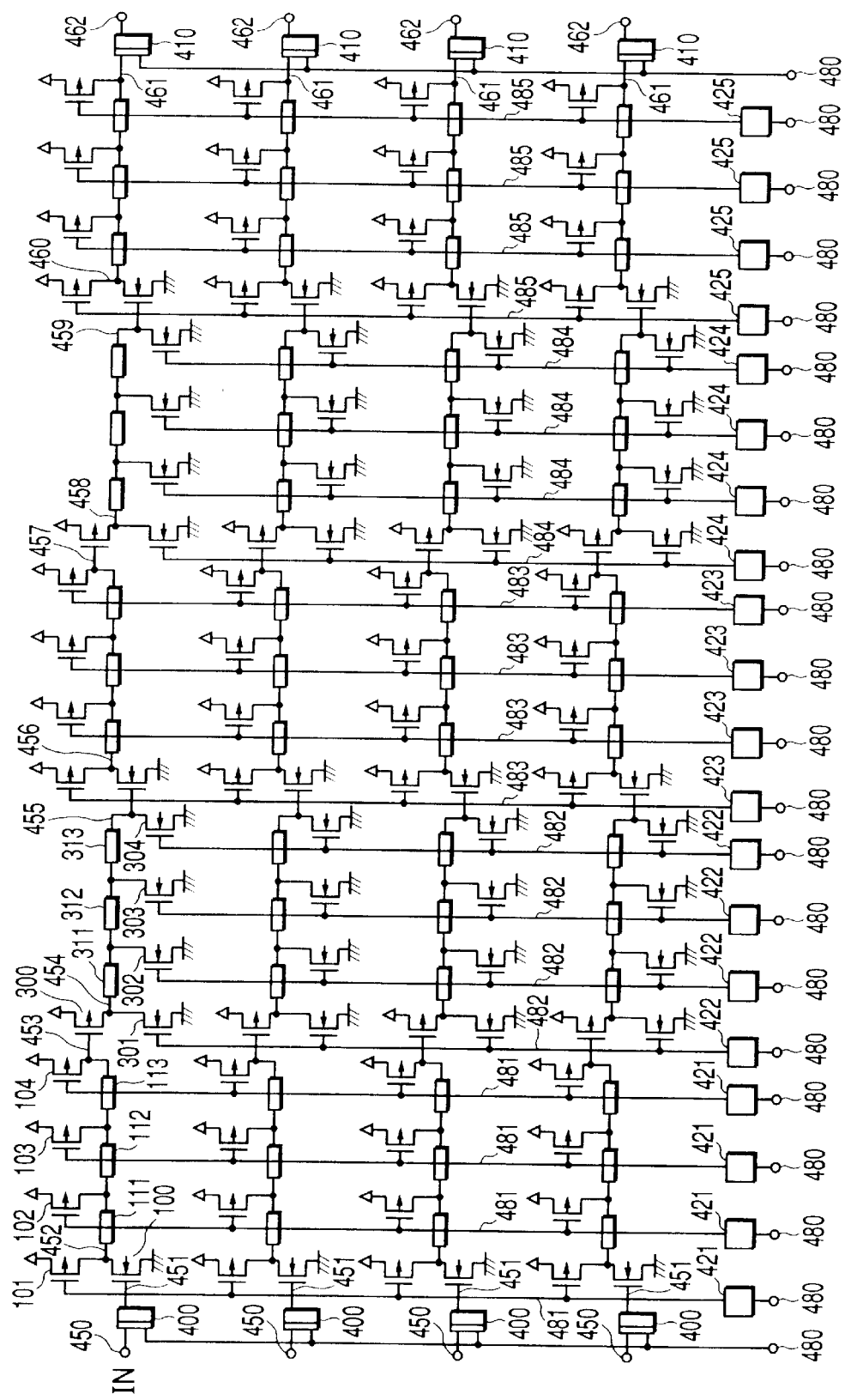
FIG. 4 is a circuit diagram showing a further embodiment of a signal transmission circuit according to the present invention.

FIG. 4 shows a further embodiment of a signal transmission circuit according to the present invention. The circuit according to the present embodiment performs multi-bit signal transmission between far-off flip-flops in a semiconductor integrated circuit chip. The circuit shown in FIG. 1 and the circuit shown in FIG. 3 are utilized in combination within signal transmission paths based on respective bits.

Since the bits-based signal paths are identical to one another in circuit configuration, attention is focused on one-bit signal path as a representative and a summary thereof will be explained. It is determined whether a flip-flop 400 on the transmitting-end side is set to pulse form or held as it is in a reset state in synchronism with a clock signal 480 according to the level of an input signal IN sent from a circuit block corresponding to a preceding stage. The output of the flip-flop 400 is transmitted through one signal transmission path so as to be transferred to a flip-flop 410 provided on the receiving-end side. A structure of a section up to a node 453 lying within the signal transmission path is similar to that of the signal transmission circuit according to the embodiment 1 shown in FIG. 1. Thus, a signal line lying within this section is precharged to a high level. It is next determined whether the signal line is driven to a low level or brought to a floating state according to the level of a node 451, i.e., the signal line is left as it is at a high level. The viewpoint that a plurality of PMOS transistors 101 through 104 for precharge are connected to the signal line corresponding to the first section at their distributed positions, is also similar to FIG. 1. A structure of a section up to a node 455, which corresponds to the next section, is similar to the embodiment 2 shown in FIG. 2. Thus, a signal line corresponding to the second section is precharged to a low level. It is next determined whether the signal line is driven to a high level or brought to a floating state according to the level of a node 453, i.e., the signal line is left as it is at a low level. The viewpoint that a plurality of NMOS transistors 301 through 304 for precharge are connected to the signal line at their distributed positions, is also similar to FIG. 2. As in the case of a section up to a node 457, a section up to a node 459 and a section up to the remaining node 461 subsequently, the sections identical in structure to FIG. 1 and the sections identical in structure to FIG. 2 exist alternately.

A clock signal 480 is a system clock signal of which a duty ratio is about 50%. The clock signal 480 is supplied to the flip-flop 400 on the transmitting-end side and the flip-flop 410 on the receiving-end side and supplied even to waveform shaping circuits 421 through 425. As the flip-flop 400 on the transmitting-end side, is used a flip-flop of a type wherein it takes in or captures an input signal 450 in synchronism with the rising edge of the clock signal 480 and brings the output node 451 to a low level in synchronism with the falling edge of the clock signal 480. A method of structuring such a flip-flop will be described later in FIG. 6. As the flip-flop 410 on the receiving-end side, is used a normal flip-flop which captures an input signal 461 in synchronism with the rising edge of the clock signal 480. Further, the waveform shaping circuits 421 through 425 are respectively circuits which are respectively activated in response to either the rising edges or the falling edges of the clock signals 480 to thereby output clock signals 481 through 485 each having a predetermined pulse width. A method of configuring such a circuit will be explained later in FIGS. 7 and 8.

Figure 5:
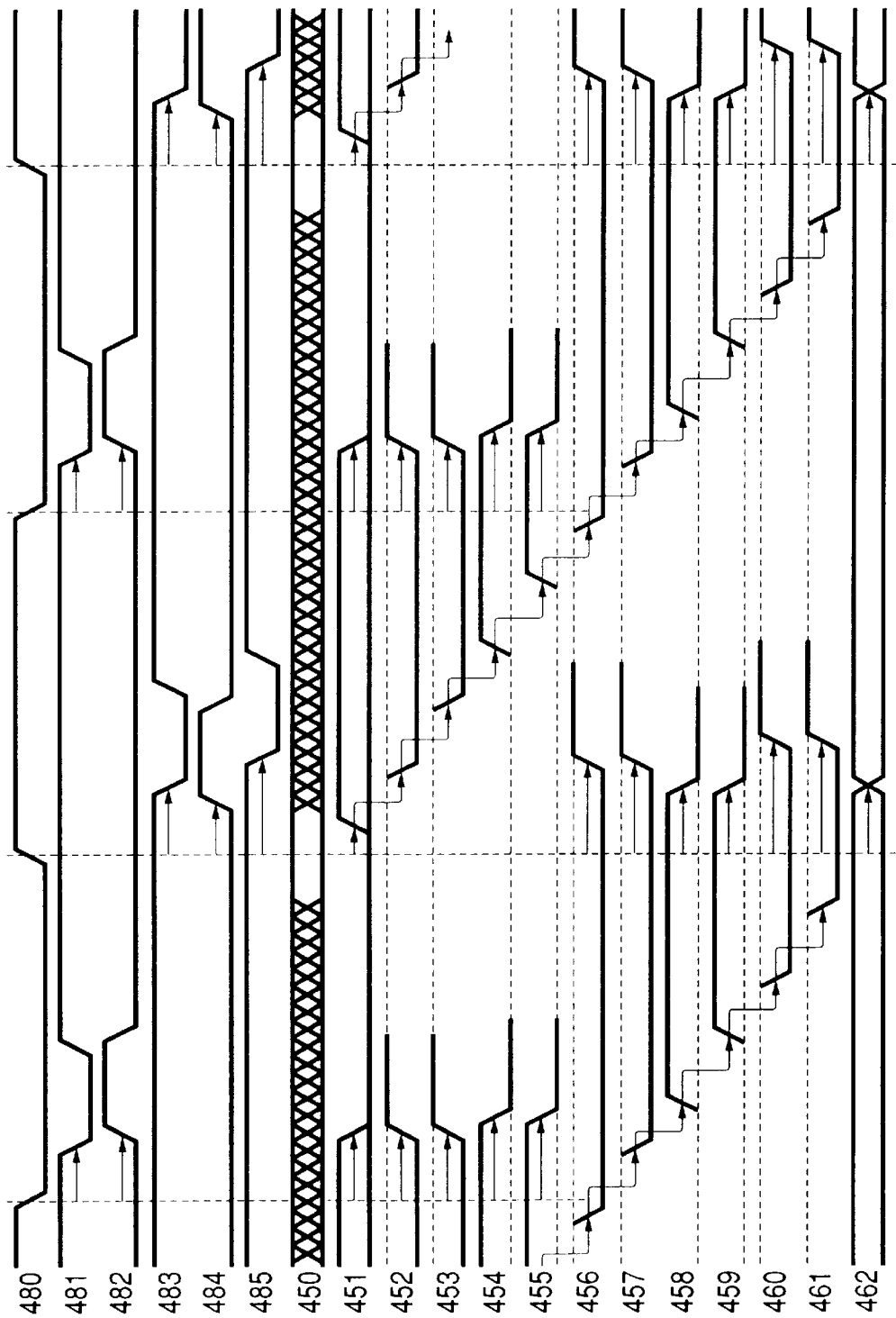
FIG. 5 is a waveform diagram for describing the operation of the signal transmission circuit shown in FIG. 4.

The operation of the signal transmission circuit shown in FIG. 4 will next be explained with reference to a waveform diagram shown in FIG. 5. In FIG. 5, operating waveforms 480 through 485 and 450 through 462 respectively indicate signal waveforms at nodes designated at the same reference numerals in FIG. 4. In the following description, these reference numerals might specify their corresponding signals themselves. The horizontal axis indicates the elapse of time and the vertical-axis direction of each waveform indicates the longitudinal level of a potential set for each signal. Further, broke lines indicate potentials held by floating nodes, and solid lines indicate signals each held in a state having a path having low resistance with respect to a high potential or a low potential. Signals indicative of two or more values at the same time indicate that any of them can be taken or selected.

The signal transmission circuit is activated in response to the falling edge of the system clock signal 480. Consequently, a pulse of a low level or a high level is outputted to each of the clock signals 481 and 482 for precharge, and a signal 451 outputted from the flip-flop 400 is brought to a low level. Thus, signals at the nodes 452 and 453 are respectively precharged to a high level, and signals at the nodes 454 and 455 are respectively precharged to a low level.

Thereafter, when the system clock signal 480 rises, the flip-flop 400 captures an input signal 450 in synchronism with its rise and determines whether the signal at the node 451 rises according to the value of the input signal 450 at this time. When the signal at the node 451 has risen, the signal is successively transferred to the nodes 452 through 455.

On the other hand, the signal transmission circuit is activated in response to the rising edge of the system clock signal 480. Consequently, a pulse of a low level or a high level is outputted to each of the clock signals 483 through 485 for precharge, and signals at the nodes 456 through 461 are respectively precharged to a high level or a low level.

If the pulse width or the like of the signal 483 is set so that the precharge of the signal at the node 456 is completed before the signal from the flip-flop 400 reaches the node 455, then the signal is transferred between the nodes 455 and 456 without any waiting.

Subsequently, the signal is transferred to the node 461 in a manner similar to above. The flip-flop 410 captures the signal in synchronism with the rising edge of the next cycle of the system clock signal 480 and outputs a signal having the operating waveform 462.

Now, MOS transistors 100, 300, etc. for transmitting signals respectively drive suitably-divided sections such as a signal-line section from 111 through 113 and a signal-line section from 311 through 313, etc. Further, the MOS transistors 101 through 104 and 301 through 304 for precharge respectively drive finer-divided sections 111, 112 and 113, and 311, 312 and 313. Accordingly, even when the distance extending from the flip-flops 400 to 410 is so long, a load on each MOS transistor for signal transmission can be reduced and hence the signal lines can be driven at high speed. Further, these signal lines can be precharged at high speed.

If the MOS transistors 104, etc. corresponding to some of the precharge MOS transistors are placed in the very near neighborhood of the next-stage MOS transistor 300 or the like for signal transmission as shown in FIG. 4, then the next-stage MOS transistor for signal transmission starts to cut off as soon as the preceding-stage precharge is started. Therefore, the time elapsed between the commencement of the preceding-stage precharge and the commencement of the next-stage precharge can be shortened. It is thus possible to shorten the time required to complete the whole precharge.

If the layout of a semiconductor chip is designed in such a manner that the multi-bit signal lines pass through paths close to each other to connect between the flip-flop 400 on the transmitting-end side and the flip-flop 410 on the receiving-end side, and the precharge MOS transistors are also placed in locations close to one another between the bits, then the circuits 421 through 425 for forming the waveforms of the clock signals as shown in FIG. 4 can be provided commonly to a multi-bit signal. In doing so, the number of the MOS transistors which constitute the circuits 421 through 425, and the fan-out number of the system clock signals 480 can be saved.

As shown in FIG. 4, the element through which the signal passes until it transmits from the signal line 113 to the signal line 311, is one PMOS transistor 300 and needs not spend the delay time necessary for the signal to only pass through the elements corresponding to the two stages as in the case of the precharge bus connecting circuit disclosed in U.S. Pat. No. 4,883,989.

Figure 6:
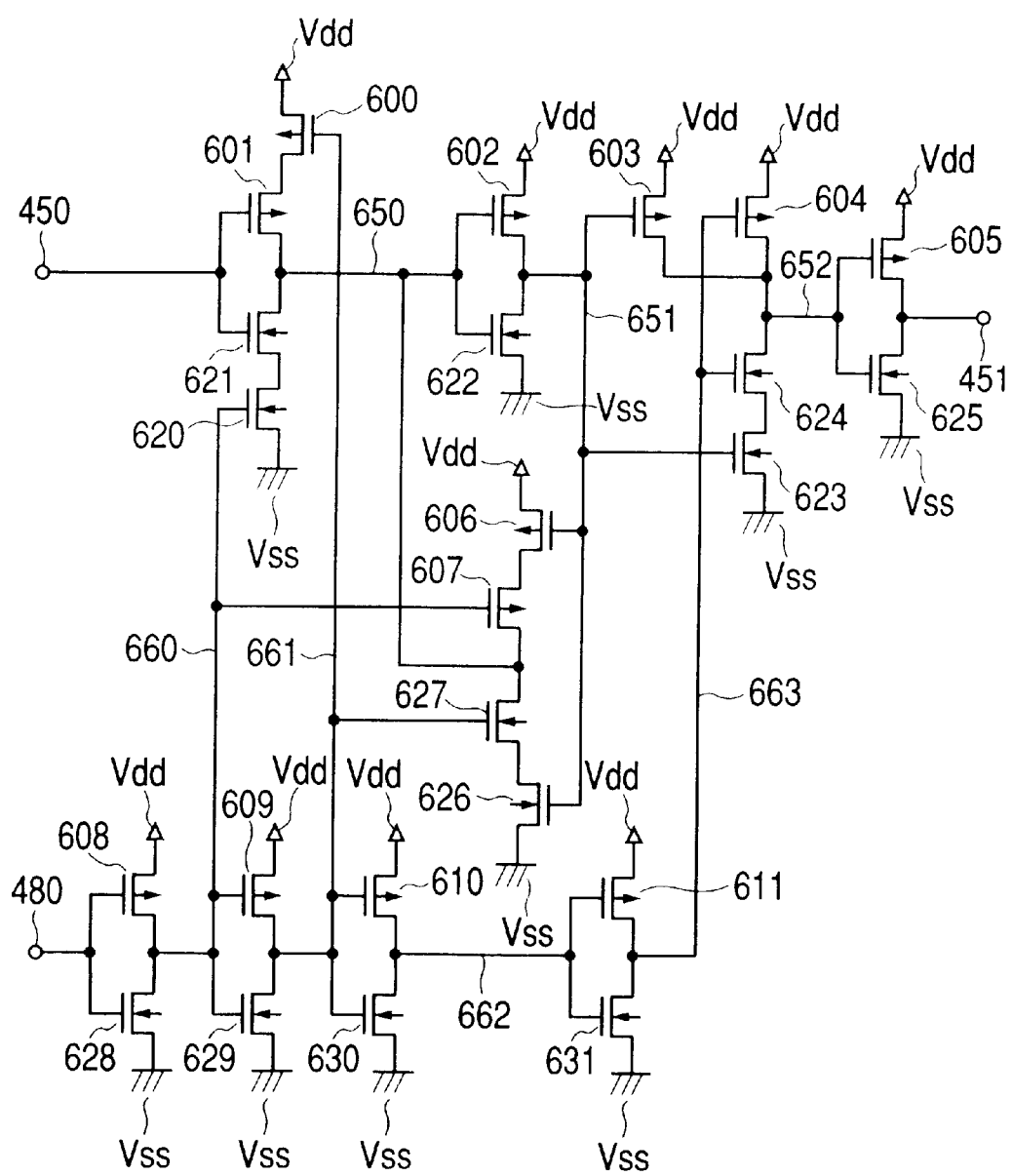
FIG. 6 is a circuit diagram depicting an example of configuration of a flip-flop circuit shown in FIG. 4.

FIG. 6 is a circuit diagram showing one example of a configuration of the flip-flop 400 used in FIG. 4 in the present embodiment. In FIG. 6, reference numerals 600 through 611 indicate PMOS transistors, and reference numerals 620 through 631 indicate NMOS transistors, respectively. Further, reference numerals 650 through 652 and 660 through 663 indicate internal signals in the flip-flop and nodes thereof respectively.

When a clock signal 480 is low in level in the flip-flop, the internal signal 663 is brought to a low level and the internal signal 652 is brought to a high level, whereby an output signal 451 is brought to a low level. At this time, the internal signal 660 is brought to a high level, the internal signal 661 is brought to a low level, and an input signal 450 is transferred to the internal nodes 650 and 651.

Thereafter, when the clock signal 480 is brought to a high level, the internal signal 660 goes low in level and the internal signal 661 goes high in level. Thus, the MOS transistors 600 and 620 are cut off so that the input signal 450 is not transmitted to the inside. Further, the MOS transistors 607 and 627 are brought into conduction so that the internal nodes 650 and 651 are held in their immediately preceding states. When the clock signal 480 is brought to the high level, the internal signal 663 is also rendered high in level and hence the value of the internal signal 651 is transferred to an output node 451.

That is, as mentioned in the description of FIG. 4, the flip-flop captures the input signal 450 in synchronism with the rising edge of the clock signal 480 and outputs it to the output node 451. When the clock signal 480 falls, the flip-flop brings the output node 451 to a low level.

Figure 7:
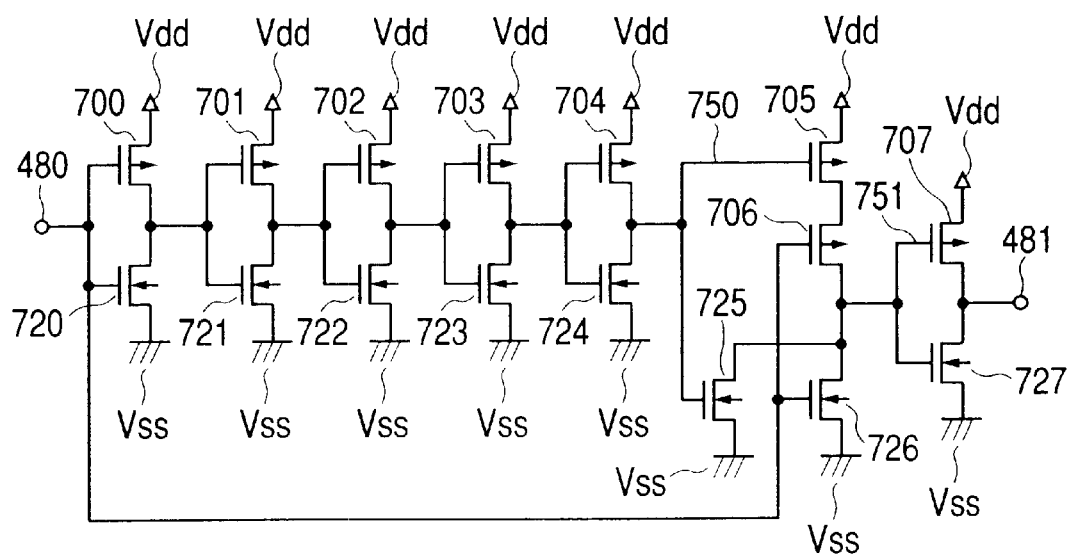
FIG. 7 is a circuit diagram illustrating an example of configuration of a circuit for forming the waveform of a clock signal shown in FIG. 4.

FIG. 7 is a circuit diagram showing one example of a configuration of one of the circuits 421 for respectively forming the waveforms of the clock signals, which are used in FIG. 4 illustrative of the present embodiment. In FIG. 7, reference numerals 700 through 707 indicate PMOS transistors, and reference numeral 720 through 727 indicate NMOS transistors, respectively. Reference numerals 750 and 751 respectively indicate internals signals in the present circuit and their nodes.

Since the present circuit is delayed by delay times of inverters of five stages respectively comprised of the MOS transistors 700 through 704 and 720 through 724 until the clock signal 480 is transmitted to the internal node 750, there is a time during which the clock signal 480 and the internal signal 750 are both brought to a low level immediately after the clock signal 480 has fallen. During that time, the internal signal 751 is brought to a high level and an output signal 481 is brought to a low level.

That is, the operating waveform of the signal 481 is obtained from the operating waveform of the signal 480 shown in FIG. 5. The pulse width thereof can be adjusted by changing the number of stages of the five-stage inverters which respectively comprise the MOS transistors 700 through 704 and 720 through 724.

Figure 8:
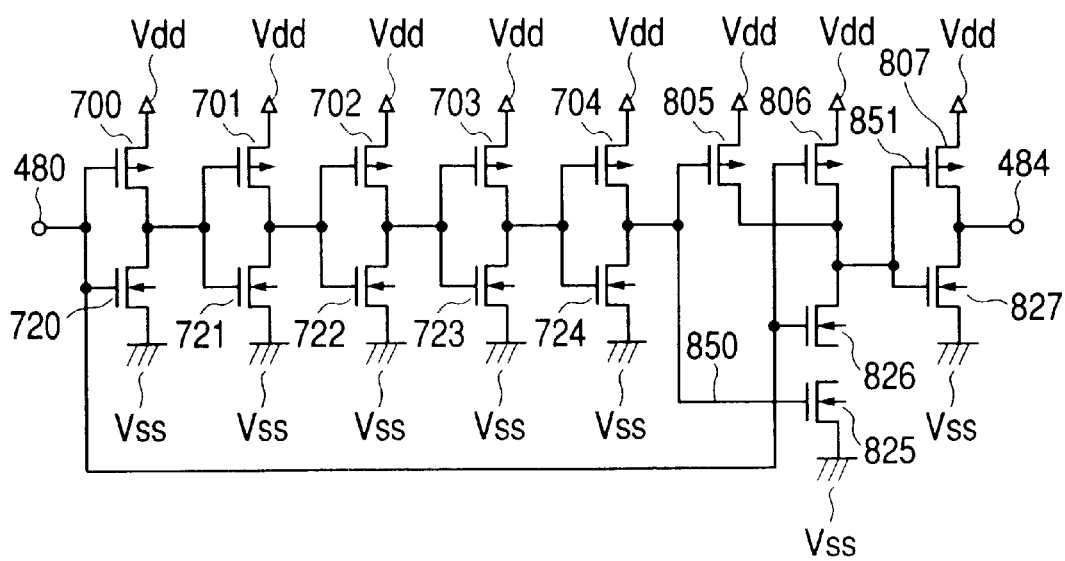
FIG. 8 is a circuit diagram showing another example of configuration of the circuit for forming the waveform of the clock signal shown in FIG. 4.

FIG. 8 is a circuit diagram showing one example of a configuration of one of the circuits 424 for respectively forming the waveforms of the clock signals, which are used in FIG. 4 illustrative of the present embodiment. A circuit configuration shown in FIG. 8 is substantially identical to that shown in FIG. 7. However, they are different in that the MOS transistors 705 and 706, and 725 and 726 constitute a NOR circuit in FIG. 7, whereas MOS transistors 805 and 806, and 825 and 826 constitute a NAND circuit. Therefore, an output signal 484 is brought to a high level only immediately after a clock signal 480 has risen in the circuit shown in FIG. 8. That is, the operating waveform of the signal 484 is obtained from the operating waveform of the signal 480 shown in FIG. 5. In FIG. 8, reference numeral 807 indicates a PMOS transistor, reference numeral 827 indicates an NMOS transistor, which constitutes an inverter, reference numeral 851 indicates an input node of the inverter, and reference numeral 484 indicates each of an output node and its signal.

Each of the circuits 422 for respectively forming the waveforms of the clock signals, which are used in FIG. 4 illustrative of the present embodiment, can be configured by, for example, allowing inverters to reverse the clock signal 480 used in the circuit shown in FIG. 8 and adding it. Further, each of the circuits 423 and 425 for respectively forming the waveforms of the clock signals can be configured by, for example, allowing the inverters to reverse the clock signal 480 used in the circuit shown in FIG. 7 and adding it. The time elapsed between the rise of the clock signal 480 and the rise of each of output signals 483 and 485 can be adjusted according to the number of stages of the inverters.

Embodiment 4

Figure 9:
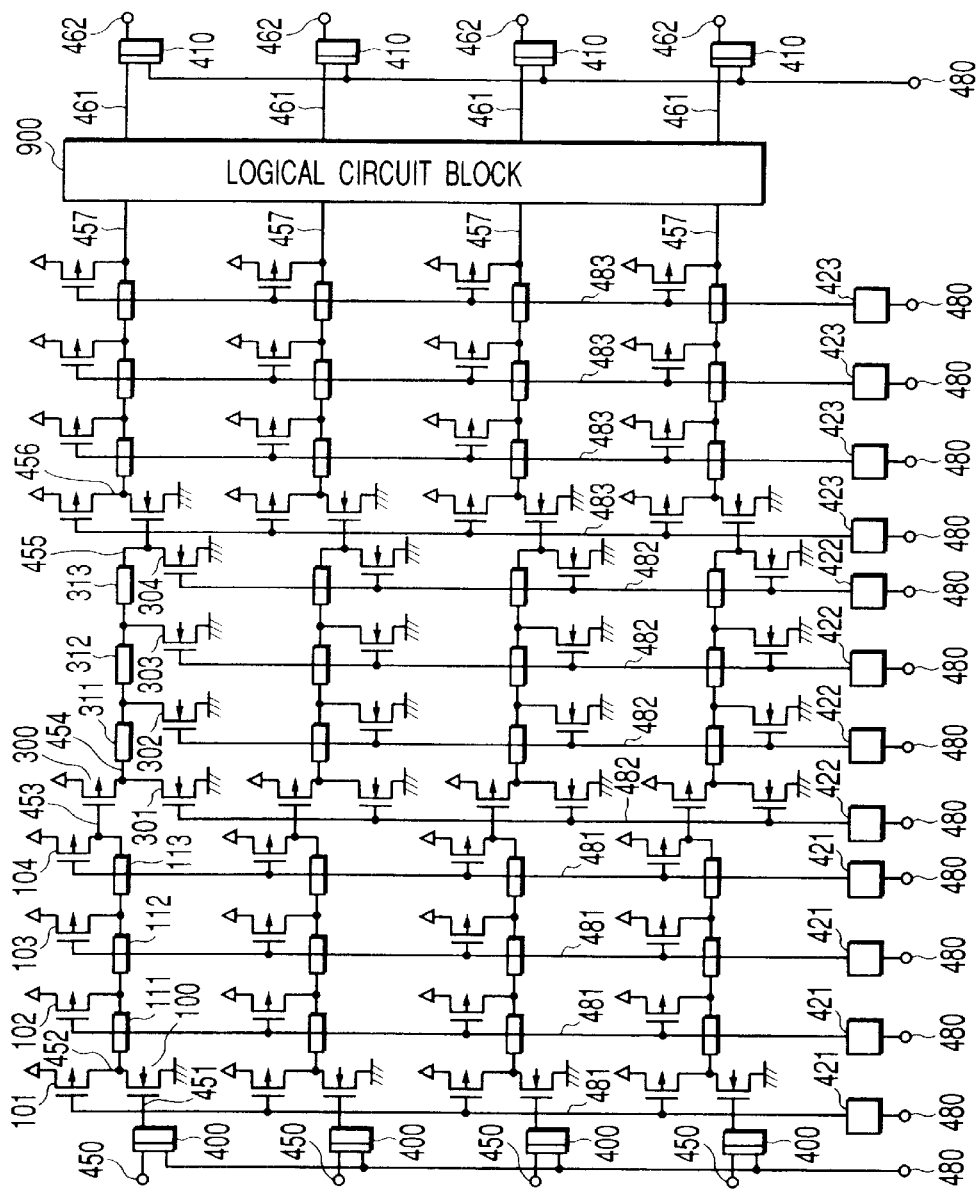
FIG. 9 is a circuit diagram depicting a still further embodiment of a signal transmission circuit according to the present invention.

FIG. 9 is a circuit diagram showing a still further embodiment of a signal transmission circuit according to the present invention. The present embodiment has a configuration wherein in the embodiment shown in FIG. 4, signals are caused to pass through a logical circuit block 900 after the transmission of the signals, and they are captured by flip-flops 410 on the receiving-end side.

The cycle of the clock signal 480 might make allowance for a signal transmission time on a signal line depending on the distance from each flip-flop 400 on the transmitting-end side to its corresponding flip-flop 410 on the receiving-end side. It is effective for such a case that the logical circuit block 900 is provided as in the present embodiment, and the signal transmission time on the signal line is matched with a delay time developed by the logical circuit block 900 to thereby fall within one cycle of the clock signal 480.

Embodiment 5

Figure 10:
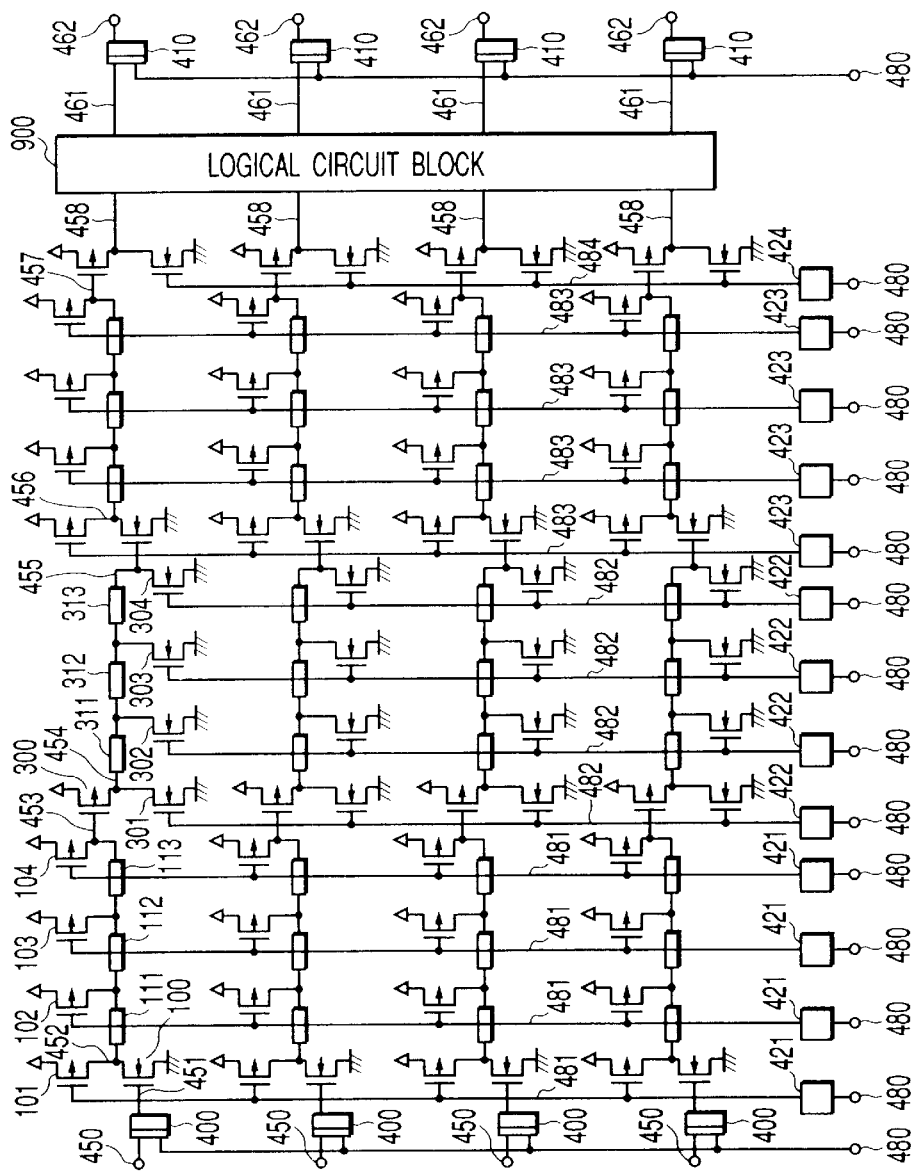
FIG. 10 is a circuit diagram showing a still further embodiment of a signal transmission circuit according to the present invention.

FIG. 10 is a circuit diagram showing a still further embodiment of a signal transmission circuit according to the present invention. The present embodiment takes a configuration in which in the embodiment shown in FIG. 9, the same drivers as FIG. 4 are provided one stage immediately before the logical circuit block 900. When the input capacitance of the logical circuit block 900 is large, the provision of the drivers in this way might allow a reduction in delay time as compared with the circuit shown in FIG. 9.

Embodiment 6

Figure 11:
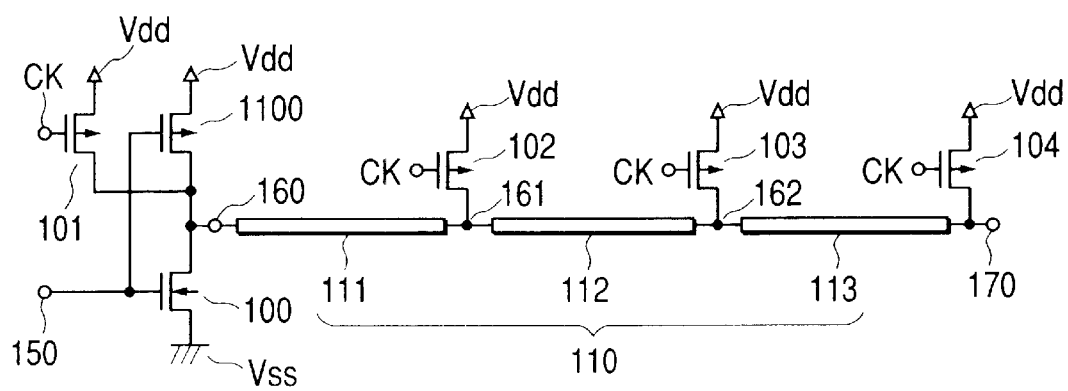
FIG. 11 is a circuit diagram illustrating a still further embodiment of a signal transmission circuit according to the present invention.

FIG. 11 is a circuit diagram showing a still further embodiment of a signal transmission circuit according to the present invention. The present embodiment takes a configuration in which in the embodiment shown in FIG. 1, a PMOS transistor 1100, which receives an input signal 150 therein, is provided in parallel with the PMOS transistor 101. When the present circuit is operated based on an extremely slow clock frequency for the purpose of a test or the like, the potential at the floating node might be changed due to current leakage in the circuit shown in FIG. 1, whereas if the MOS transistor 1100 is inserted as in the circuit shown in FIG. 11, then it can be prevented from occurring. Incidentally, when the present circuit is operated based on a normal clock frequency, it is activated in a manner similar to the circuit shown in FIG. 1 but is delayed by an increase in input capacitance or the like of the MOS transistor 1100. Thus, it is desirable that the gate width of the MOS transistor 1100 is designed as small as possible.

Embodiment 7

Figure 12:
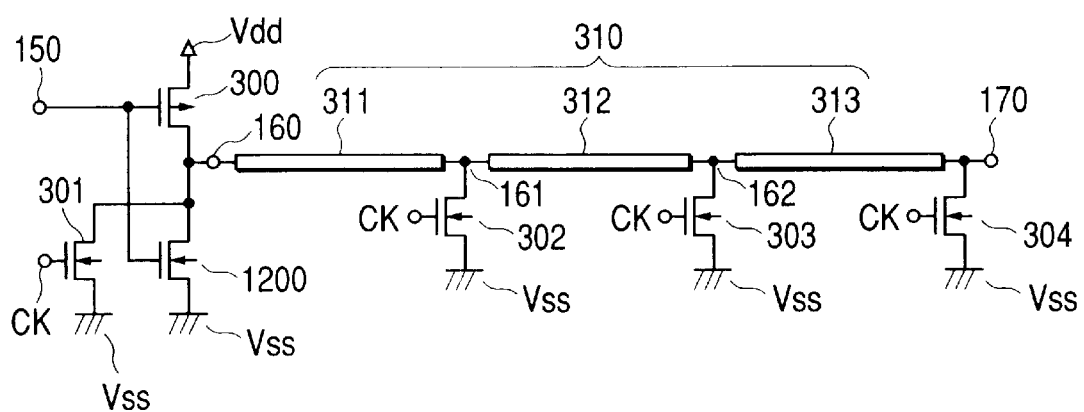
FIG. 12 is a circuit diagram showing a still further embodiment of a signal transmission circuit according to the present invention.

FIG. 12 is a circuit diagram showing a still further embodiment of a signal transmission circuit according to the present invention. The present embodiment adopts a configuration in which in the embodiment shown in FIG. 3, an NMOS transistor 1200, which receives an input signal 150 therein, is provided in parallel with the NMOS transistor 301. An object and an effect for providing the MOS transistor 1200 are identical to those for providing the PMOS transistor 1100 in the embodiment shown in FIG. 11.

Embodiment 8

Figure 13:
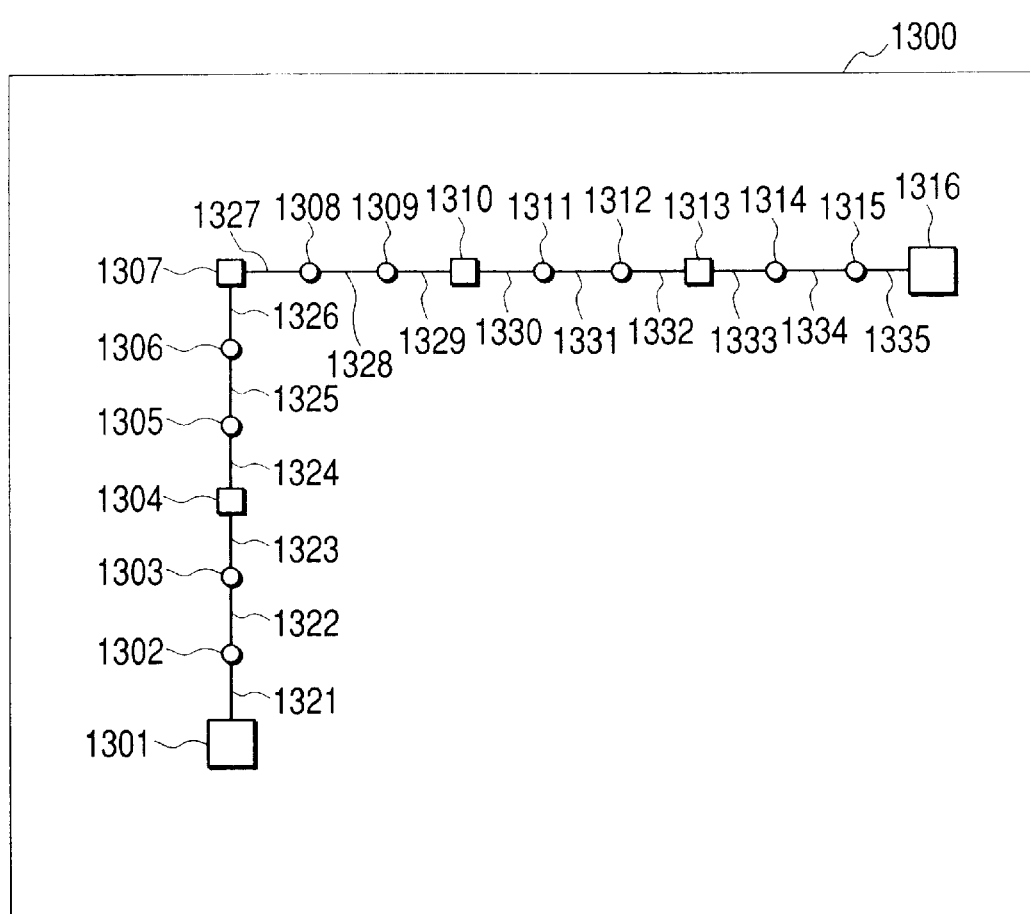
FIG. 13 is a layout diagram illustrating one embodiment of a semiconductor integrated circuit device according to the present invention.

FIG. 13 is a layout diagram showing one embodiment of a semiconductor integrated circuit device according to the present invention. The present drawing shows one example in which the signal transmission circuit shown in FIG. 4 illustrative of the embodiment 3 is mounted on a semiconductor integrated circuit chip and embodied. In FIG. 13, reference numeral 1300 indicates a semiconductor integrated circuit chip, reference numerals 1301 through 1316 indicate positions where the NMOS transistors, PMOS transistors and flip-flops shown in FIG. 4 are placed, and reference numerals 1321 through 1335 indicate positions where the long-distance signal lines shown in FIG. 4 are placed. Further, a circuit block on the transmitting side of a signal to be transferred is placed in the position designated at 1301, and a circuit block on the receiving side of the signal to be transferred is also placed in the position designated at 1316.

Of the long-distance signal lines shown in FIG. 4, the long-distance signal line designated at reference numeral 111, and four bits in total for the long-distance signal lines represented in other bits and having a connecting bearing on it are placed in the position designated at reference numeral 1321 shown in FIG. 13. Similarly, the long-distance signal line designated at reference numeral 112 and the long-distance signal lines corresponding to four bits in total, which are associated with it, are placed in the positions designated at reference numeral 1322; the long-distance signal line designated at reference numeral 113 and the long-distance signal lines corresponding to four bits in total, which are associated with it, are placed in the position designated at reference numeral 1323; and the long-distance signal line designated at reference numeral 311 and the long-distance signal lines corresponding to four bits in total, which are associated with it, are placed in the position designated at reference numeral 1324, respectively. Subsequently, the signal lines designated at reference numeral 312 and later reference numerals and the long-distance signal lines corresponding to four bits in total, which are associated with them respectively, are successively placed in their corresponding positions designated at reference numerals 1325 through 1335.

Of the elements of structure shown in FIG. 4, the four bits for the flip-flops 400, the NMOS and PMOS transistors 100 and 101, the NMOS transistors and PMOS transistors corresponding to four bits in total, which are respectively associated with them, and the circuit 421 which corresponds to one of the circuits 421 for respectively supplying the clock signals, and is connected to the PMOS transistors 101 and the PMOS transistors for other bits associated with them, are placed in the position designated at reference numeral 1301 shown in FIG. 13. The PMOS transistor 102 and PMOS transistors corresponding to four bits in total, which are associated with it, and the circuit 421 for supplying the clock signal, which corresponds to one of the circuits 421 and is connected to these PMOS transistors, are placed in the position designated at reference numeral 1302; and the PMOS transistor 103 and PMOS transistors corresponding to four bits in total, which are associated with it, and the circuit 421 for supplying the clock signal, which is connected to these PMOS transistors, are placed in the position designated at reference numeral 1303, respectively.

Further, the PMOS transistors 104 and 300 and the NMOS transistor 301, the PMOS and NMOS transistors corresponding to four bits in total, which are respectively associated with them, and the circuit 421 for supplying the clock signal, which correspond to one of the circuits 421 and is connected to these PMOS transistors, are placed in the position designated at reference numeral 1304.

In a manner similar to above subsequently, the MOS transistors corresponding to four bits, which are connected between the long-distance signal lines placed in the positions designated at reference numerals 1324 through 1335, and the circuits for respectively supplying the clock signals to these are respectively successively placed in the positions designated at reference numerals 1305 through 1315.

The flip-flop 410 and the PMOS transistors corresponding to four bits, which are connected to it, and the circuit connected to these PMOS transistors, of the circuits 425 for respectively supplying the clock signals are placed in the position designated at reference numeral 1316.

If the components are laid out as described above, then the transmission of a signal can be speeded up over the range of from the position designated at 1301 to the position designated at 1316 within the semiconductor integrated circuit chip 1300 by using the signal transmission circuit shown in FIG. 4 illustrative of the embodiment 3.

Figure 14:
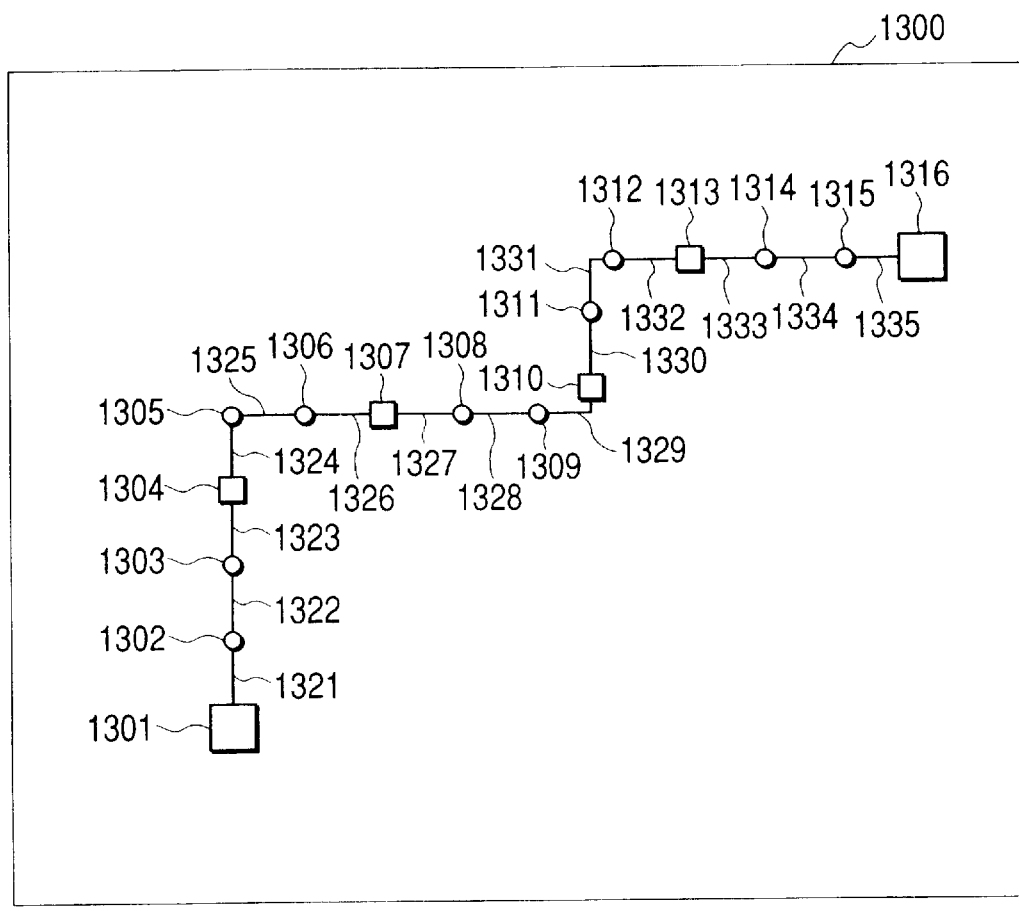
FIG. 14 is a diagram depicting another layout example of a semiconductor integrated circuit device according to the present invention.
Figure 15:
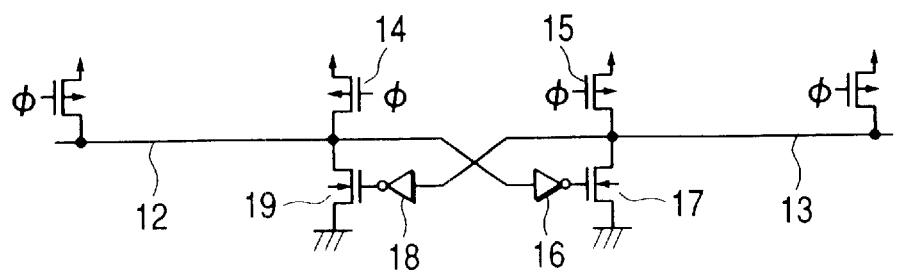
FIG. 15 is a circuit diagram illustrating another example of a conventional signal transmission circuit.

FIG. 13 has shown the case in which the signal transmission path is bent in one place at the position designated at 1307. It is however possible to bend the signal transmission path in plural places as shown in FIG. 14 or bend it in places other than the places where the MOS transistors are mounted.

While the preferred embodiments of the present invention have been described above, the present invention is not limited to the aforementioned embodiments. It is needless to say that various design changes can be made thereto within the scope not departing from the spirit of the present invention. While the respective embodiments shown in FIGS. 4, 9 and 10 have been configured on the basis of the embodiments shown in FIGS. 1 and 3, these can be configured on the basis of the embodiments shown in FIGS. 11 and 12.

According to the signal transmission circuit of the present invention as is apparent from the aforementioned embodiments, the influence of the resistance of a signal line can be lessened and the signal line can be precharged at high speed by using MOS transistors small in gate width. Thus, the parasitic capacitance can be reduced and the transmission of a signal can also be speeded up.

Thus, the use of the signal transmission circuit for the transmission of a signal within a chip allows the implementation of a semiconductor integrated circuit device in which the signal transmission within the chip has been speeded up.

What is claimed is:

1. A signal transmission circuit for transmitting signals represented in plural bits from a first circuit block placed on a semiconductor chip to a second circuit block placed thereon, wherein signal paths for the respective bits are identical in circuit configuration to one another, and the respective signal paths are partitioned into a plurality of signal transmission sections connected in tandem, each of the signal transmission sections corresponding to odd numbers in said plurality of signal transmission sections of the signal paths for the respective bits including,
  a first signal line for transmitting a signal to a circuit corresponding to a subsequent stage;
  first precharge means connected to a plurality of nodes of said first signal line and for precharging said first signal line to a first potential through each individuals of said plurality of nodes; and
  first driving means for driving said signal line to a second potential according to an input from a circuit corresponding to a preceding stage;
 each of the signal transmission sections corresponding to even numbers in said plurality of signal transmission sections of the signal paths for the respective bits including,
  a second signal line for transferring a signal to a circuit corresponding to a subsequent circuit;
  second precharge means connected to a plurality of nodes of said second signal line and for precharging said second signal line to the second potential through each individuals of said plurality of nodes; and
  second driving means for driving said signal line to the first potential according to an input from a circuit corresponding to a preceding stage.

2. The signal transmission circuit according to claim 1, wherein said first precharge means includes a plurality of first conduction type MOS transistors respectively connected between a first power line for the first potential and each individuals of the plurality of nodes of said first signal line, and said second precharge means includes a plurality of second conduction type MOS transistors respectively connected between a second power line for the second potential and each individuals of the plurality of nodes of said second signal line.

3. The signal transmission circuit according to claim 2, wherein control signals generated by single waveform shaping are parallel applied to gates of MOS transistors connected to corresponding nodes of corresponding signal lines on the signal lines for the plural bits.

4. A signal transmission circuit for transmitting a signal from a first circuit block placed on a semiconductor chip to a second circuit block placed thereon, said signal transmission circuit being partitioned into a plurality of signal transmission sections, each of the signal transmission sections corresponding to odd numbers in said plurality of signal transmission sections including,
  a first signal line for transmitting a signal to a circuit corresponding to a subsequent stage;
  first precharge means connected to a plurality of nodes of said first signal line and for precharging said first signal line to a first potential through each individuals of said plurality of nodes; and
  first driving means for driving said signal line to a second potential according to an input from a circuit corresponding to a preceding stage;
 each of the signal transmission sections corresponding to even numbers in said plurality of signal transmission sections including,
  a second signal line for transferring a signal to a circuit corresponding to a subsequent circuit;
  second precharge means connected to a plurality of nodes of said second signal line and for precharging said second signal line to the second potential through each individuals of said plurality of nodes; and
  second driving means for driving said signal line to the first potential according to an input from a circuit corresponding to a preceding stage.

5. The signal transmission circuit according to claim 4, wherein the plurality of nodes of said first signal line are distributed to the neighborhood of a start point of said first signal line, the neighborhood of an end thereof, and an intermediate position which substantially uniformly divides between the start point and the end.

6. The signal transmission circuit according to claim 4, wherein the plurality of nodes of said second signal line are distributed to the neighborhood of a start point of said second signal line, the neighborhood of an end thereof and an intermediate position which substantially uniformly divides between the start point and the end.

7. The signal transmission circuit according to claim 4, wherein said first precharge means includes a plurality of first conduction type MOS transistors respectively connected between a first power line for the first potential, and each individuals of the plurality of nodes of said first signal line, and said second precharge means includes a plurality of second conduction type MOS transistors respectively connected between a second power line for the second potential, and each individuals of the plurality of nodes of said second signal line.

8. The signal transmission circuit according to claim 4, wherein a periodically-changed clock signal is applied to each of gate electrodes of said first conduction type plural MOS transistors and said second conduction type plural MOS transistors.

9. The signal transmission circuit according to claim 4, wherein said first driving means is connected between the second power line and the first signal line and comprises second conduction type MOS transistors each having a gate electrode to which a signal inputted from a preceding stage is applied, and said second driving means is connected between the first power line and the second signal line and comprises first conduction type MOS transistors each having a gate electrode to which a signal inputted from a preceding stage is applied.

\* \* \* \* \*